United States Patent [19]

Watson

[11] Patent Number: 4,578,650

[45] Date of Patent: Mar. 25, 1986

[54] RESONANCE DRIVE OSCILLATOR CIRCUIT

[75] Inventor: William S. Watson, Eau Claire, Wis.

[73] Assignee: Watson Industries, Inc., Eau Claire, Wis.

[21] Appl. No.: 504,572

[22] Filed: Jun. 15, 1983

[51] Int. Cl.[4] .......... H03B 5/32

[52] U.S. Cl. .......... 331/160; 331/109; 331/116 R; 310/316; 310/317; 73/505

[58] Field of Search .......... 310/316, 317; 331/109, 331/116 R, 160; 73/505

[56] References Cited

U.S. PATENT DOCUMENTS

| | | | |
|---|---|---|---|
| 2,544,646 | 3/1951 | Barnaby et al. | 264/1 |
| 2,817,779 | 12/1957 | Barnaby et al. | 310/25 |
| 3,742,492 | 6/1973 | Proctor | 310/316 X |
| 3,842,681 | 10/1974 | Barnaby et al. | 73/505 |
| 3,992,952 | 11/1976 | Hutton et al. | 73/505 |
| 4,019,391 | 4/1977 | Ljung | 73/505 |
| 4,044,297 | 8/1977 | Nobue et al. | 331/116 R X |

FOREIGN PATENT DOCUMENTS

| | | | |
|---|---|---|---|
| 0771774 | 10/1980 | U.S.S.R. | 310/317 |

*Primary Examiner*—Eugene R. LaRoche
*Assistant Examiner*—Robert J. Pascal
*Attorney, Agent, or Firm*—Merchant, Gould, Smith, Edell, Welter & Schmidt

[57] ABSTRACT

An electronic drive circuit for driving an actuator mass for a sensor apparatus is disclosed. The driver requires no compensation or bridge elements. The actuator mass is directly driven by a square wave drive signal such that all of the capacitors loading errors associated with the driven actuator means are concentrated in time to that time interval in which the drive signal traverses between its two stable states. A sensor circuit connected to monitor the sensor output response signal is blanked out during the drive signal transition time interval, which effectively eliminates the transition drive noise energy from the sensed output signal.

12 Claims, 2 Drawing Figures

RESONANCE DRIVE OSCILLATOR CIRCUIT

TECHNICAL FIELD

This invention relates generally to an electronic drive circuit, and more particularly to a circuit for driving actuator/mass combinations in optimum and controlled resonance over a wide range of resonance frequencies, particularly for such applications as sensor instrumentation.

BACKGROUND OF THE INVENTION

Instrumentation sensors which operate on a principle of vibration of constrained actuator masses are known in the art. Unlike their gyroscopic instrumentation counterparts, they require no rotating parts. Their vibrating actuator masses may take a number of different configurations such as reed members, piezoelectric crystals, or electromagnetic members.

The principle of operation of vibratory mass instrumentation sensors is relatively simple. If the mass is vibrated or maintained in oscillation in a straight line in which it is guided by a constraint, the oscillating mass will not apply any force (other than its own weight) in a direction transverse to the guide as long as the guide maintains a constant orientation in space. However, if a guide is forced to rotate about an axis at right angles to itself, the oscillating member will apply alternating or pulsating forces to the guide member, the average magnitude of which will be proportional to the angular velocity of the forced rotation. Such forces can be measured by sensors such as piezoelectric crystals. The forces exerted by the oscillating actuator mass on the sensor crystal causes measurable electrical potential signals to be developed on the faces of the sensor crystal, which signals can be measured and calibrated to the rate of turn of the sensor instrument.

A drive circuit is required for such vibrating mass sensor instrumentation systems, for establishing and maintaining the vibrating or oscillatory state of the actuator mass at an optimum level throughout the operative period of the instrument. Generally in such instrumentation, it is most desirable to vibrate the actuator mass at its natural resonance. At any point in time such natural resonance of the mass will occur at a fixed frequency, known as the resonant frequency of the mass. When the mass is vibrated at its resonant frequency, the mass provides its maximum measurable output signal for use by the instrument's sensor. If the amplitude of the actuator mass oscillations can be maintained at a constant level throughout the period of operation of the instrument, high measurement accuracy can be maintained indefinitely by the instrument.

In general, the actuator mass driver circuits of the prior art have taken two basic configurations. The first configuration involves the use of "separate" hardware or elements for performing the "driving" function and the drive "detection" function. In such drive structures, the separate functions are required to allow control of resonance of the mass. Examples of driver circuits constructed according to this configuration are illustrated in U.S. Pat. Nos. 3,992,952 to Hutton et al (FIG. 2); 3,842,681 (FIG. 1); and 2,544,646 to Barnaby et al (FIG. 8). Each of these configurations include physical encumbrances on the sensor system in the form of specific structure arranged and configured to sense the resonant motion of the vibratory mass and to provide a sensed feedback signal for the system. Such physical encumbrances and attachments, besides requiring expensive fabrication, unduly complicate the drive circuitry.

The second actuator mass driver circuit configuration that is typically used in the art eliminates the need for the extra sensing element by using the actuator drive mass itself to provide the resonance sensing signal. An example of such a drive configuration is illustrated in U.S. Pat. No. 2,817,779 to Barnaby et al (FIG. 11) as well as in my U.S. Pat. No. 4,479,098 issued on Oct. 23, 1984 and entitled Resonance Drive Oscillator. Drive circuits of this configuration generally use a balanced bridge configuration with the actuator drive mass or element as one leg of the bridge and a dummy or compensation element (which simulates the drive actuator mass but is not a part of the physical resonance of the system) as the other leg of the bridge. The bridge is excited by a sine wave signal. Imbalances in the bridge circuit, which are intended to repesent the resonant motion, are sensed and used to maintain the excitation signal.

While the bridge configuration is adequate for most purposes it is not ideal for all applications. One problem with the bridge configuration driver circuit is that of identically "matching" the physical characteristics of the dummy bridge element with those of the actuator drive element, particularly in a manner such that the dummy and actuator mass parameters track over time and temperature. Since the frequency at which the natural resonance of the actuator mass occurs can vary considerably with changes in temperature, the actuator mass driver circuit must be able to instantaneously track such resonant frequency shifts and simultaneously drive the actuator mass at the new resonant frequency level in order to maintain the output amplitude of the actuator mass at a constant, maximum level. Any erroneous imbalance of the bridge network (as a result of parameter mismatch between the dummy and actuator drive elements) causes a phase shift in the resonance signal, which can lead to further errors in the subsequent demodulation of the objective signal of the system. The bridge imbalance as a result of such component mismatch also provides an amplitude error, which can lead to further inaccuracies in the demodulated signal.

Heretofore, the drive signal for the actuator and compensation masses of such drive circuits have been sinusoidal waveforms so as to provide a smooth oscillatory drive transition to the driven mass. The use of squarewave drive signals for the driven masses was generally considered to be avoided, since significant current/voltage spikes would be introduced into the driver circuitry, through the actuator mass, at the "step" transition drive portions of the drive signal. Such undesirable spikes are not readily eliminated by conventional filtering techniques.

With the advent of improved actuator mass structures such as monolithic crystal structures, the phase requirements of the drive system become more critcal. The physical encumbrances of the separate driver/detection configurations become too burdensome and limit the accuracy of the system. The inaccuracies of the bridge configuration resulting from mismatch between the drive element and the compensating element become more critical, and cannot always be tolerated within the accuracies of the system. In short, the drive configurations of the prior art have required one to contend with physical complexity or phase errors that cannot be tolerated for all applications.

The present invention effectively addresses and overcomes the above-mentioned deficiencies of prior art actuator mass driver circuits. The present invention provides an actuator drive circuit that neither requires the dual drive/detection circuitry nor the compensating bridge circuitry of the prior art actuator mass driver configurations. The present invention entirely eliminates the compensation elements and the need for parameter matching that lead to time and temperature tracking errors as with prior art sensor circuits. The present invention uses a square-wave drive signal, heretofore throught unsuitable for use with sensitive sensor circuitry. The drive circuitry of this invention is suitable for use with either piezoelectric or magneto-electromagnetic actuating configurations. Phase shift and amplitude errors in the resonant drive signal are minimized with the use of the present invention.

SUMMARY OF THE INVENTION

The present invention provides a simple circuit configuration for driving an actuator mass without requiring any compensation bridge circuitry. The actuator mass is directly excited or driven by a square wave drive signal. By concentrating substantially all of the system errors to that period of time associated with the square-wave drive "transition" time, and by blanking the sensing of resonance in the system during the drive transition, the phase and amplitude error occuring during such transition time are eliminated. In short, no compensation elements are required in the system, and all phase-error producing effects are limited to the "blanked" transition time. When a piezoelectric mass is being driven, a drive voltage is used and the sensed current is blanked during the transition period. When an electromagnetic actuator mass is being driven by a drive current, the sensed voltage will be blanked during the transition period. The drive apparatus is enabled to drive the actuator mass at its natural resonance so as to maintain the constant value of the actuator/mass output signal and its phase, even though the instantaneous frequency at which such natural resonance occurs may vary widely over any particular operative time period of the system.

According to one embodiment of the invention, there is provided a drive circuit means arranged and configured for operative connection to an actuator mass, for energizing the actuator mass for movement according to a square-wave drive signal moving between first and second energy levels. The actuator mass produces a periodic actuator output signal when so energized. There are also provided sense means operatively connected with the actuator mass for sensing the actuator output signal and for providing a sensed output signal in response thereto. A blanking circuit means is operatively connected with the sense means for actively blanking the sensed signal during those transition times when the drive signal moves between its first and second energy levels. According to a preferred configuration, the blanking circuit means comprises a switching circuit that responds to the periodic transition of the drive signal between its first and second energy levels. The blanking circuit may include timing circuit means for controlling the blanking time period of the circuit, which is significantly shorter than the period of the driving signal. According to a preferred configuration of a resonance drive circuit constructed according to the principles of this invention, there are provided feedback circuit means operatively connecting the sense means and the drive circuit means for providing a closed loop gain control path therebetween.

While the preferred embodiment of the invention will be described with respect to its application in driving a piezoelectric crystal, it will be noted that other types of actuator elements (particularly electromechanical types of actuator elements) can be used within the spirit and broad scope of this invention. Similarly, while a particular configuration of switching circuitry will be described with regard to the blanking circuitry, it will be understood that many other configurations of such blanking circuit will fall within the scope of this invention. For example, the blanking portion of the circuitry may be, but is not limited to, any type of low impedance switching device such as a field effect transistor, silicon controlled rectifier or switching transistor. Similarly, while a particular mode of activating the blanking switch means will be illustrated, it will be understood that such switching means could be activated by numerous activation techniques such as by capacitive coupling, transformer coupling, optical coupling, appropriate logic, and the like.

It will be noted that while the current sensing function is illustrated with respect to the preferred embodiment network as being sensed between the drive source and the actuator element, that such sensing may be performed at other locations in the circuitry, such as between the actuator element and the signal return path or between the signal source and the power supply.

It will readily be understood by those skilled in the art, that other variations may be made to the circuitry components of the preferred embodiment used for illustration purposes only in describing the invention. For example, but not by way of limitation, the comparator circuit may be replaced by a phase-locked-loop. Similarly, the level control circuitry block may comprise a simple diode clamp network, or could represent a gain limiting network such as one utilizing a field effect transistor or an analog multiplier. In general, the level control signal may be generated by any means that will detect the current signal amplitude and produce a limit control signal change in response thereto, which tends to correct the current signal amplitude to a desired level. It will be appreciated by those skilled in the art, that the driver portion of the circuit must have a low output impedance, a high slew rate, and an output amplitude that represents its input amplitude. As will be appreciated by those skilled in the art, any number of diverse circuits such as high speed operational amplifiers, bipolar transistors, field effect transistors, and the like may satisfy implementation of the driver circuit. These and other modifications of the invention will become aparent to those skilled in the art in light of the following description of a preferred embodiment of this invention.

DESCRIPTION OF THE PREFERRED EMBODIMENT

Figure 1:
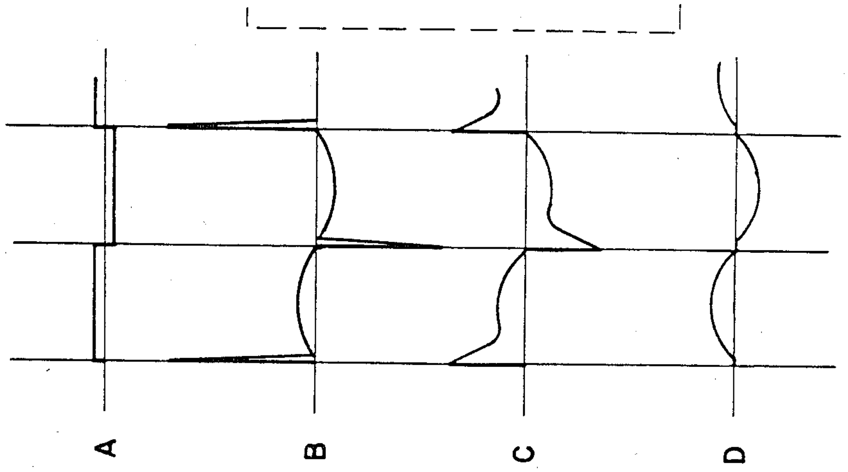
FIG. 1 represents a comparative graph of sensed output signals of a square-wave driven actuator mass with and without use of the blanking circuit of this invention.

Referring to the Drawing, wherein like numerals represent like parts throughout the several views, a comparative waveform diagram is illustrated in FIG. 1. The square-wave at FIG. 1A represents a drive signal that is applied by the driver apparatus of this invention directly to an actuating mass such as a piezoelectric crystal. Such a square-wave activation signal represents a significant departure from the smooth sinusoidal activation waveforms heretofore used in the prior art. The waveform at FIG. 1B illustrates the current response signal generated within a piezoelectric crystal driven by the square-wave signal of FIG. 1A, in the absence of the "blanking" circuit of this invention. Large current spikes occur at the square-wave transition point. Such current spikes, if allowed to remain in the responsive signal (as illustrated at FIG. 1A) would normally make such sensed signal unusable for a sensor application.

FIG. 1C illustrates the sensed current waveform of the actuator mass activated by the square-wave signal of FIG. 1A, when an attempt is made to "filter" out the current spikes of FIG. 1B. It is noted that attempted filtering only further distorts the crystal response signal by spreading the energy contained in the spikes over longer time periods. The result is unusable for accurate sensing applications.

The representation of FIG. 1D illustrates the sensed output signal from the actuator mass energized with the square-wave signal of FIG. 1A, when the principles of signal blanking during the square-wave drive transition periods is practiced according the principles of this invention. As illustrated in FIG. 1D, the large current spikes of the FIG. 1B signal are virtually eliminated from the sensed output signal by blanking of the transition periods from the sensed signal. Only a slight flatness or distortion appears on the current sensed signal of FIG. 1D at the "crossover" locations, which low-level distortions can be readily filtered, to provide a clean smooth sine wave output having a minimum of phase error as a result of variations in the actuator mass.

Figure 2:
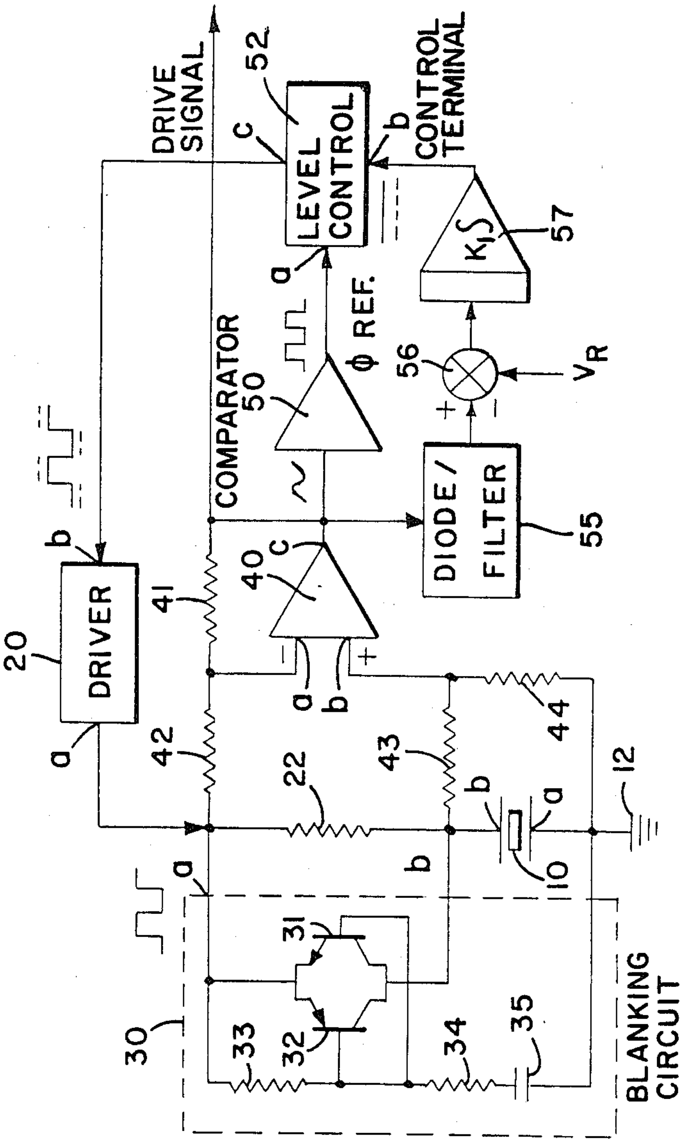
FIG. 2 is a schematic diagram illustrating a circuit configuration for implementing the resonance drive circuit of this invention for driving a piezoelectric crystal.

With the above background, the present invention will be described with reference to a preferred embodiment of the invention as illustrated in FIG. 2. Referring thereto, an actuator mass 10 is appropriately configured and mounted to be driven or energized by a driver signal. Such mounting and configuration of the actuator mass do not form a part of this invention. A number of such configurations and arrangements will be readily known by those skilled in the art. One such mounting configuration is illustrated in my copending patent application Ser. No. 614,336, filed on May 25, 1984 entitled Angular Rate Sensor Apparatus. To the extent that the disclosures and teachings of my copending application are applicable herein, the disclosures of that application are herein incorporated by reference. The crystal 10 has a first terminal generally designated at 10*a* directly connected to the reference potential 12, and also has second terminal 10*b*.

A driver circuit generally designated at 20 has an output terminal 20*a* and a feedback input terminal 20*b*. The driver circuit may be constructed of any appropriate circuitry characterized by a low output impedance, a high slew rate, and a drive signal at its output terminal that has an amplitude which represents the amplitude of the signal applied to its input or feedback terminal 20*b*. By way of example, the driver network 20 may be constructed from a high speed operational amplifiers, by means of bipolar transistors, field effect transistors or the like.

The signal output from the Driver network 20 is applied by means of a current monitoring resistor 22 to the surface 10*b* of the actuator mass crystal 10. The driver output 20*a* is also applied to the input terminal 30*a* of a blanking circuit generally designated at 30. The blanking circuit 30 also has an output terminal 30*b* that is connected to the surface 10*b* of the crystal 10.

The blanking network 30 may assume a number of configurations, and basically comprises a low impedance switching circuit configured around a field effect transistor, a silicon controlled rectifier, or switching transistors. In the preferred embodiment illustrated, the blanking circuit has an npn transistor 31 and a pnp transistor 32, the emitters of which are directly connected to the input terminal 30*a* of the blanking network. The collectors of the transistors 31 and 32 are directly connected to the output terminal 30*b* of the blanking network. The bases of the transistors 31 and 32 are connected in common and by means of a biasing resistor 33 to the input terminal 30*a* of the blanking network. The bases of transistors 31 and 32 are also connected by means of a resistor 34 in series with a timing capacitor 35 to the reference 12. While a particular biasing configuration for the switching transistors 31 and 32 of the blanking network 30 is illustrated in the figure, it will be understood that the switching means of the blanking circuit could be activated by a number of different techniques, such as by capacitive coupling, transformer coupling, optical coupling, appropriate logic and the like.

An operational amplifier 40 monitors the current flow through resistor 22. The amplifier 40 is in the form of a differential amplifier having an inverting input terminal 40*a*, a non-inverting input terminal 40*b* and a signal output terminal 40*c*. A feedback resistor 41 is connected between the signal output terminal 40*c* and the inverting input terminal 40*a* of the amplifier 40, and the inverting input terminal 40*a* is also connected by means of a resistor 42 to the output terminal 20*a* of the driver network 20. The non-inverting input terminal 40*b* of the amplifier 40 is connected by means of a resistor 43 to the surface 10*b* of the crystal 10 and is also connected by means of a resistor 44 to the reference bus 12.

The signal output from the amplifier 40 is applied through a comparator 50 to a phase reference input terminal 52*a* of a level control network 52. As previously mentioned, the comparator could also be replaced by a phase locked loop. The level control network further has a voltage reference input control terminal 52*b* and a signal output terminal 52*c*. The output terminal 52*c* is directly connected to provide a limiting control signal to the feedback input terminal 20*b* of the driver network 20. The level control network may be of a simple diode clamp configuration or a gain limiting circuit of the type, for example, which uses a field effect transistor or an analog multiplier, as is well-known in the art.

The output signal from the output terminal 40*c* of the amplifier 40 is applied through a diode and filter network generally designated at 55 to a summing junction 56. The diode and filter network may be of any suitable configuration for filtering the slight crossover distortion perturbations appearing on the sensed current signal resulting from blanking of the signal during transition periods of the drive signal. A reference voltage ($V_R$) is also applied to the summing junction 56 and is subtracted from the filtered signal applied thereto from the filter network 55. The resultant signal is applied by means of an integrator 57 to the control terminal 52*b* of the level control network 52.

The comparator and integrator network measures the peak value of the detected current signal, compares such measured peak value with the reference voltage ($V_R$) and integrates the errors therebetween by means of the integrator 57, to provide a control signal to the level control network 52 that tends to correct or drive the current signal amplitude to a desired specific peak current level. While a particular configuration for generating the level control signal has been illustrated, it will be understood that any appropriate circuitry could be used which will detect the current signal amplitude and produce a level control signal change in response thereto, which tends to correct the current signal amplitude to a desired level.

By driving the actuator mass (i.e. crystal 10) with a square-wave signal, the piezo transducer capacitance load effects of the actuator mass are concentrated within a very small portion of the cycle time (i.e. only at the transition periods of the drive source signal between its upper and lower limits). These capacitance load effects are illustrated as the "spike" portions of the curve of FIG. 1B. By simply shorting out current flow through the resistor 22 during the undesired spike interval, the undesired loading effect can be entirely eliminated from the closed-loop system. Such shorting out of resistor 22 is referred to herein as "blanking" out of the current sensing through resistor 22 during that time interval referred to as a "blanked" time interval, and is performed by the blanking switching network 30. As the drive signal changes operative levels during a transition period, the switching transistors 31 and 32 are momentarily energized for a time constant as determined by the resistor and capacitor 34 and 35, to shunt current away from current sensing resistor 22. Once the energy spike passing through the crystal 10 has subsided, the transistor 31 and 32 will be biased so as to switch to an electrically "open" mode, reinserting the current sensing resistor 22 back into the circuitry. The net effect of the blanking circuit action is to temporarily inhibit generation of the current sensing signal during the transition crossover interval of the drive signal.

As can be readily appreciated, no compensation elements are required with the circuitry of this invention. Accordingly, phase parameters of the system are preserved to a very high degree. In addition, the amplitude of the response signal can be controlled very accurately. Further, as previously stated, the comparator network could be replaced with a phase locked loop to allow for phase division if desired, such as for quadrature corrector demodulation.

In a preferred configuration of the invention constructed according to the FIG. 2 schematic, a piezoelectric crystal 10 of 2000 pf and 2500 hz is used. For such implementation, the capacitor 35 has a value of 300 pf. Other values of the resistors used in this circuit are as follows: R33 (2.7 kohm); R34 (1 kohm); R22 (150 ohm); R42 (1.15 kohm); R41 (100 kohm); R43 (1 kohm) and R44 (100 kohm).

From the foregoing description, it will be appreciated that the present invention solves many of the problems and deficiencies associated with prior art actuator mass drive configurations. It will be understood that while a specific application for the present invention as used in association with driving a piezoelectric crystal for an instrumentation system has been disclosed, the invention is also applicable to the driving of other actuator/-mass configurations and for use in other types of systems. Further, while specific circuit components and arrangements have been disclosed in association with the description of a preferred embodiment of the invention, it will be understood that many other variations of such circuitry are possible within the spirit and broad scope of this invention. Other modifications of the invention will be apparent to those skilled in the art in light of the foregoing description. This description is intended to provide a specific example of an individual embodiment which clearly discloses the present invention. Accordingly, the invention is not limited to the described embodiment, or to the use of specific elements therein. All alternative modifications and variations of the present invention which fall within the spirit and broad scope of the appended claims are covered.

I claim:

1. Drive circuit apparatus for energizing an actuator mass at its natural resonance, comprising:

(a) drive circuit means arranged and configured for operative connection to an actuator mass, for energizing said actuator mass for movement according to a square-wave drive signal moving between first and second energy levels; said actuator mass producing a periodic actuator output signal when so energized;

(b) sense means operatively connected with said actuator means for sensing said actuator output signal and for providing a sensed signal in response thereto; and (c) blanking circuit means operatively connected with said sense means for actively blanking said sensed signal at those transition times when said drive signal moves between said first and said second energy levels.

2. Drive circuit apparatus as recited in claim 1, wherein said blanking circuit means comprises a switching circuit responsive to the periodic transition of said drive signal between said first and said second energy levels.

3. Drive circuit apparatus as recited in claim 2, wherein said blanking circuit means blanks blank said sensed signal at transition time periods that are much less than the period of said drive signal.

4. Drive circuit apparatus as recited in claim 1, wherein said sense means comprises current sensing circuit means for sensing current flow through said actuator mass.

5. Drive circuit apparatus as recited in claim 4, wherein said actuator mass comprises a piezoelectric crystal.

6. Drive circuit apparatus as recited in claim 1, wherein said blanking circuit means includes timing circuit means for controlling the period of time during which said sensed signal is blanked.

7. Drive circuit apparatus as recited in claim 1, including feedback circuit means operatively connecting said sense means and said drive circuit means for providing a closed loop gain control circuit therebetween.

8. The combination of an actuator mass of the type that produces oscillatory motion in response to an impressed voltage and an output voltage in response to an impressed force, and a drive circuit, comprising:

(a) drive amplifier means operatively connected to drive the actuator mass for applying a drive voltage to the actuator mass in response to a feedback signal, said drive voltage abruptly moving between first and second energy levels; whereby the actuator mass produces an actuator output signal representing both physical and electrical parameters;

(b) sensor means operatively connected to directly receive said actuator output signal, for producing a sensed output signal in response thereto;

(c) feedback circuit means operatively connected to receive said sensed output signal for producing said feedback signal in response thereto; wherein said feedback signal has phase characteristics suitable for causing the actuator mass to be driven at its natural resonance, and amplitude characteristics suitable for maintaining the amplitude of said actuator output signal at a constant predetermined level over a broad range of dynamically changing natural resonance frequencies;

(d) means operatively connecting the feedback circuit means with the drive amplifier means for applying said feedback signal to said drive amplifier means; whereby a closed-loop drive circuit is established; and (e) blanking circuit means operatively connected with said sensor means for actively blanking said sensed output signal at those transition times when said drive voltage moves between said first and said second energy levels.

9. The apparatus as recited in claim 8, wherein said blanking circuit means comprises an active switching network.

10. The apparatus as recited in claim 8, wherein said feedback circuit means includes filter means operatively connected to receive said sensed output signal for removing minor perterbations from said sensed output signal resulting from blanking portions of said sensed output signal.

11. The apparatus as recited in claim 8, wherein said drive voltage is generally square-wave in shape.

12. An angular rate sensor comprising:

(a) an actuator mass suitable for producing a periodic actuator output signal when driven by a periodic drive signal;

(b) driver circuit means operatively connected with said actuator mass for driving said actuator mass with a square-wave drive signal moving between first and second energy levels;

(c) sensor means arranged and configured for sensing said actuator output signal and for providing a sensed signal in response thereto; and (d) blanking circuit means operatively connected with said sensor means for blanking said sensed signal at those transition time intervals when said drive signal moves between said first and said second energy levels.

* * * * *